United States Patent [19]

Kominami et al.

[11] 4,412,189
[45] Oct. 25, 1983

[54] SWITCHABLE SIGNAL COMPRESSOR/SIGNAL EXPANDER

[75] Inventors: Yasuo Kominami, Kokubunji; Tetsuo Sato, Fussa; Yuichi Ohkubo, Kodaira, all of Japan

[73] Assignee: Hitachi, Ltd., Tokyo, Japan

[21] Appl. No.: 262,814

[22] Filed: May 12, 1981

[30] Foreign Application Priority Data

May 19, 1980 [JP] Japan ................................. 55-65382
May 19, 1980 [JP] Japan ................................. 55-65384

[51] Int. Cl.³ ............................................ H04B 1/64
[52] U.S. Cl. ...................................... 333/14; 333/174
[58] Field of Search .................. 333/14; 330/109, 126; 455/72; 179/1 P

[56] References Cited

U.S. PATENT DOCUMENTS 3,729,693 4/1973 Dolby .................................. 333/14

OTHER PUBLICATIONS

Yamaguchi et al., *A New Configuration Using a Voltage Controlled Amplifier for a Dolby System Integrated Circuit*, IEEE Trans on CE, vol. CE-25, Nov. 1979, pp. 723–730.

Primary Examiner—Paul L. Gensler
Attorney, Agent, or Firm—Antonelli, Terry & Wands

[57] ABSTRACT

Either an input signal of a combining network or an output signal of an inverter arranged on a main path is fed to a side path through a mode switch in a switchable signal compressor/signal expander. Since an input terminal of a control amplifier is connected to a variable filter without passing through a signal amplifier, the deviation of the detection characteristic of a rectifier and integrator attributed to D.C. offset voltages of the signal amplifier and the control amplifier can be reduced. On the other hand, a switchable signal compressor/signal expander in another aspect of performance has a reference voltage generator for producing a D.C. reference voltage, and the output D.C. level of the control amplifier is maintained at a level approximate to the D.C. reference voltage. The other ends of first and second capacitors of the rectifier and integrator are also supplied with the D.C. reference voltage, so that the fluctuation of the detection characteristic of the rectifier and integrator ascribable to the fluctuation of the D.C. reference voltage is reduced.

13 Claims, 5 Drawing Figures

SWITCHABLE SIGNAL COMPRESSOR/SIGNAL EXPANDER

BACKGROUND OF THE INVENTION

This invention relates to a noise reduction system which is provided with a signal compressor and a signal expander.

It has heretofore been known that, in order to improve the signal-to-noise ratio of a certain specified communication system or specified recording and playing system, a noise reduction system provided with a signal compressor and a signal expander is employed.

In particular, a noise reduction system in which circuit constituent parts of the signal compressor and the signal expander are shared and in which the function of the signal compressor and that of the signal expander can be switched through the use of a mode switch has been proposed in "The Journal of the Society of Electronic and Radio Technicians (The SERT Journal)," Vol. 8, May/June, 1974, FIG. 1 shows a circuit block diagram of this switchable circuit compressor/signal expander. The switchable signal compressor/signal expander of this type is well known to those skilled in the art as a "Dolby B-type Noise Reduction System" (the word "Dolby" is a registered trademark of Dolby Laboratories).

When switched to the signal compressor, the Dolby B-type noise reduction system serves as an encoder. The signal compressor (encoder) compresses the dynamic range of input signals before the input signals are recorded on a recording tape. When switched to the signal expander side, this system serves as a decoder. The signal expander (decoder) restores the linearity of the dynamic range for the input signals. Noise which tends to be introduced in the recording/playing process is considerably reduced in this way, so that the combination of the signal compressor and the signal expander functions as a noise reduction system. in the Dolby B-type noise reduction system, the operations of signal compression/signal expansion are performed usually for signal components which are higher than a frequency value of 200 Hz.

Referring now to the circuit block diagram of FIG. 1, the well-known encoder/decoder will be described in detail. The noise reduction system shown in FIG. 1 has a main path $l_m$ which extends between an input terminal $T_1$ and an output terminal $T_2$, and a side path $l_s$ which extends between a mode switch SW for the encoder/decoder switching and the output terminal $T_2$. On the main path $l_m$, a combining network 10 and an inverter 11 are provided in series. On the side path $l_s$, there are arranged a variable filter 12, a signal amplifier 13, a control amplifier 14, a rectifier and integrator 15, and an overshoot suppressor 16.

In the case where the mode switch SW is connected to a terminal $T_3$, this circuit arrangement serves as an encoder. The combining network 10 and the inverter 11 on the main path $l_m$ perform a linear amplification. In response to a control signal $S_c$ generated by the rectifier and integrator 15, the variable filter 12 changes the quantity of transfer for a signal component having a frequency above 200 Hz. More specifically, when the level of an input signal at the common terminal $T_5$ of the mode switch SW has lowered, the quantity of transfer from the variable filter 12 increases owing to a loop which consists of the variable filter 12, the signal amplifier 13, the control amplifier 14 and the rectifier and integrator 15. With the lowering of the input signal level, therefore, signal components at frequencies above 200 Hz on the side path $l_s$ increase.

In the case where the circuit blocks are arranged into an encoder, the signal on the side path $l_s$ is added to a signal on the main path $l_m$. As shown in the amplitude-frequency characteristics in FIG. 2, accordingly, signal components at frequencies above 200 Hz come to have greater amplitude values gradually as signal levels lower.

On the other hand, in the case where the mode switch SW is connected to a terminal $T_4$, the circuit blocks constitute a decoder. The inverter 11 on the main path $l_m$ is constructed as a signal inverter, and an output signal from the inverter 11 is applied to the common terminal $T_5$ of the mode switch SW, so that the side path $l_s$ is supplied with a signal having a phase opposite to that of the input signal applied to the input terminal $T_1$. Accordingly, the signal on the side path $l_s$ is subtracted from the signal on the main path $l_m$. In the amplitude-frequency characteristics of the output signals from the decoder, therefore, the signal components at frequencies above 200 Hz come to have smaller amplitude values gradually as the signal levels lower.

The overshoot suppressor 16 limits the amplitude value of the terminal voltage which is to be applied to the variable filter 12. Unless the overshoot suppressor 16 is provided, an undesired change will develop in a transient signal of high level.

On the other hand, we have found that a great deviation in the detection characteristic of the rectifier and integrator 15 arranged on the side path $l_s$ occurs in the switchable signal compressor/expander of the known type. Especially, this disadvantage is particularly evident in the case where the output terminal of the signal amplifier 13 and the input terminal of the control amplifier 14 are D.C coupled. In a monolithic semiconductor integrated circuit, a decrease in the number of terminals is an important design objective from the viewpoint of the reduction of cost, and hence, the D.C. coupling between circuits is eagerly requested. It is required, however, that even with such D.C. coupling, various circuit characteristics do not depart from permissible ranges with respect to desired design values.

SUMMARY OF THE INVENTION

We have found that the aforecited disadvantage of the prior art is ascribable to the cascade connection of the signal amplifier 13 and the control amplifier 14, resulting in the fact that a D.C offset voltage appearing at the output terminal of the signal amplifier 13 and a D.C. offset voltage appearing at the input terminal of the control amplifier 14 afford an undesirable deviation in the operating point of the rectifier and integrator 15.

Accordingly, a first object of this invention is to provide a switchable signal compressor/signal expander whose circuit characteristics depart little from the desired design values thereof on account of the D.C. coupling between circuits.

A second object of this invention is to provide a switchable signal compressor/signal expander whose detection characteristic has only a small deviation.

As the fundamental feature of a first aspect of performance according to this invention, the input terminal of a control amplifier on the side path is not D.C. coupled to the output terminal of a signal amplifier but is connected to a variable filter.

As the fundamental feature of a second aspect of performance according to this invention, the other ends of capacitors in a rectifier and integrator on the side path are not grounded but are supplied with a reference voltage which is generated from a reference voltage generator in order to set a control amplifier at a predetermined operating point.

DESCRIPTION OF THE PREFERRED EMBODIMENTS

Hereunder, this invention will be more specifically described with reference to the accompanying drawings.

Figure 1:
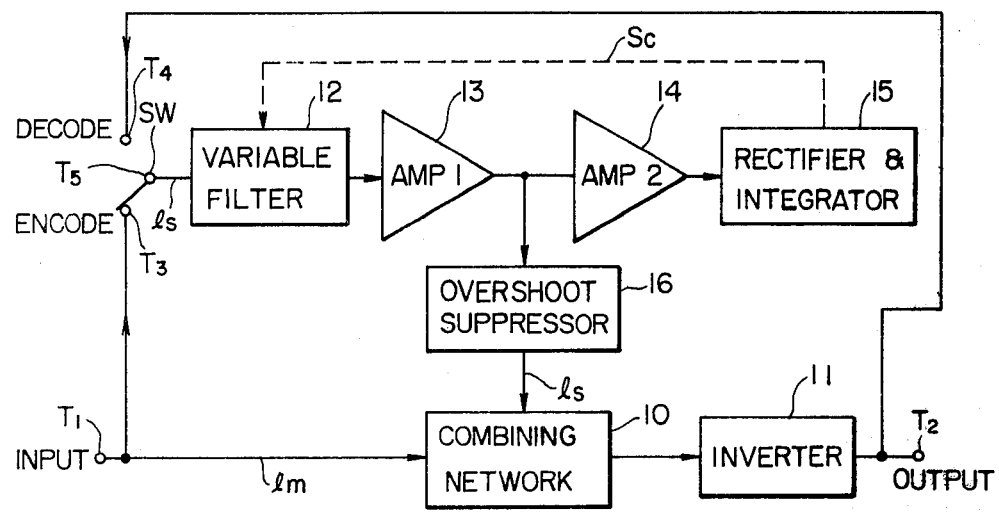
FIG. 1 is a schematic block diagram of a switchable signal compressor/signal expander of the type known in the prior art.
Figure 2:
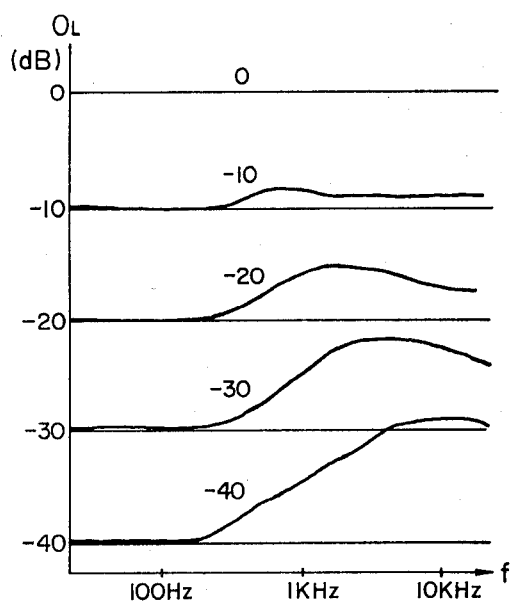
FIG. 2 is a diagram of amplitude-frequency characteristics in the case where the circuit blocks of FIG. 1 are arranged into a signal compressor.
Figure 3:
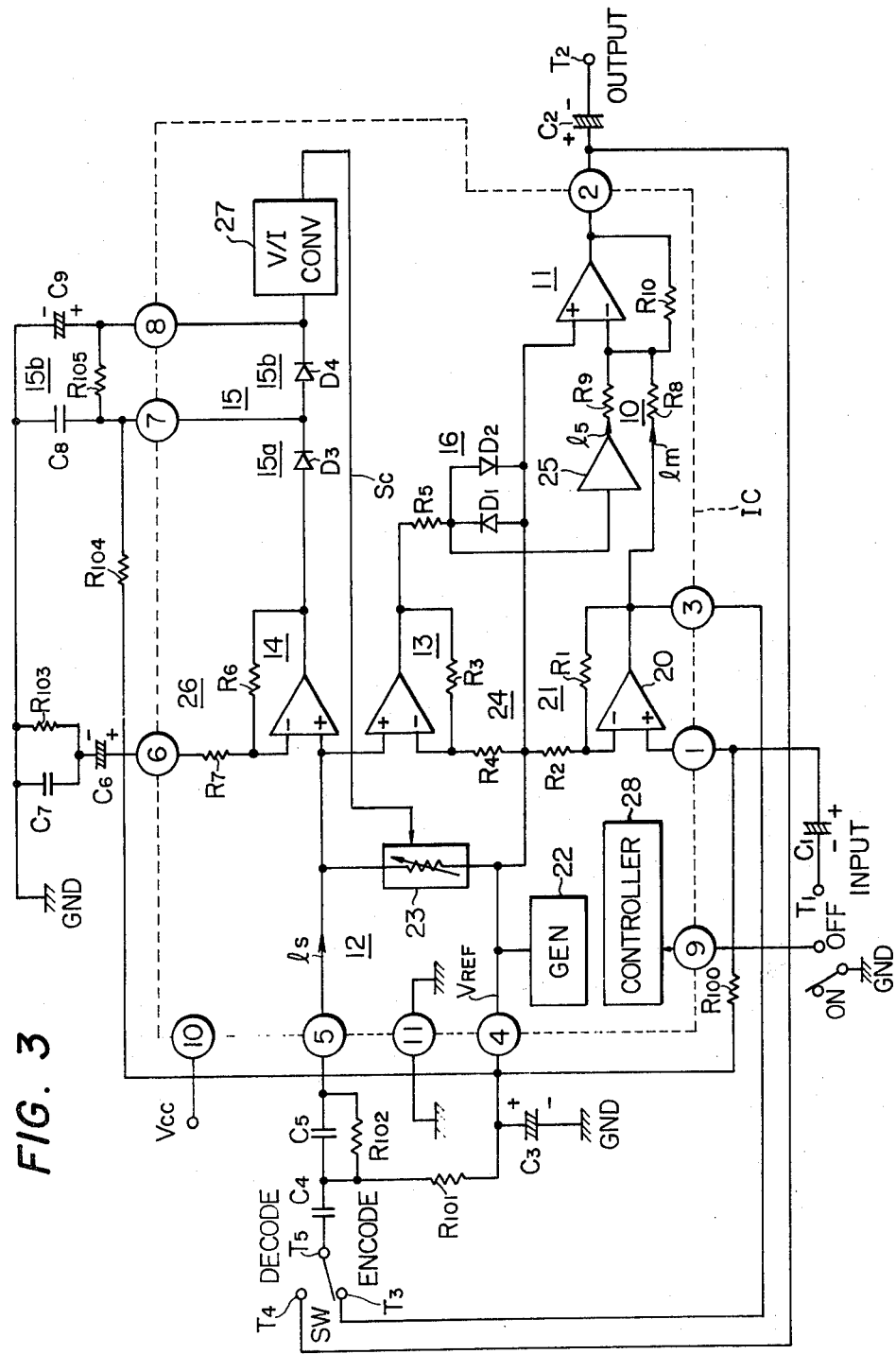
FIG. 3 is a schematic block diagram of a switchable signal compressor/signal expander according to an embodiment of this invention.

FIG. 3 shows a switchable signal compressor/signal expander according to an embodiment of this invention. Components within the broken lines IC are constructed as a monolithic semiconductor integrated circuit. Numerals enclosed with circles indicate terminal Nos. of the integrated circuit.

A combining network 10 and an inverter 11 are arranged on a main path $l_m$ which extends between an input terminal $T_1$ and an output terminal $T_2$. The input terminal $T_1$ is connected to the No. 1 terminal of the integrated circuit through an input coupling capacitor $C_1$. An input amplifier 20 is constructed in the form of a so-called operational amplifier, and has a non-inverting input terminal (+), an inverting input terminal (−) and an output terminal. The non-inverting input terminal (+) is connected to the terminal No. 1. The output terminal of this amplifier is connected to a terminal $T_3$ of a mode switch SW outside the integrated circuit as the No. 3 terminal of the integrated circuit, and is also connected to the main path $l_m$. A negative feedback network 21 constructed of resistors $R_1$ and $R_2$ is connected between the output terminal and the inverting input terminal (−) of the input amplifier 20, whereby the voltage gain of this input amplifier 20 is set.

One end of the resistor $R_2$ of the negative feedback network 21 is grounded A.C.-wise by a capacitor $C_3$ which is connected to No. 4 terminal. A reference voltage generator 22 feeds the terminal No. 4 with a D.C reference voltage $V_{REF}$ which is set at a level equal to about a half of a supply voltage $V_{CC}$. A resistor $R_{100}$ is connected between the terminals No. 1 and No. 4, whereby the D.C. reference voltage $V_{REF}$ is fed to the terminal No. 1. Accordingly, the D.C. potential of the output terminal of the input amplifier 20 is set at a level approximate to the D.C. reference voltage $V_{REF}$.

On a side path $l_s$ extending between the mode switch SW and the output terminal $T_2$ there are arranged a variable filter 12, a signal amplifier 13, a control amplifier 14, a rectifier and integrator 15 and an overshoot suppressor 16. Particularly, according to the fundamental feature of this invention, one input terminal of the signal amplifier 13 and one input terminal of the control amplifier 14 are connected to the variable filter 12. The variable filter 12 is constructed of capacitors $C_4$ and $C_5$, resistors $R_{101}$ and $R_{102}$ and a variable impedance 23.

The mode switch SW is connected to No. 5 terminal of the integrated circuit through the capacitors $C_4$ and $C_5$. The variable impedance 23 is connected to this terminal No. 5.

The signal amplifier 13 is constructed in the form of a so-called operational amplifier, and has a non-inverting input terminal (+), an inverting input terminal (−) and an output terminal. The non-inverting input terminal (+) is connected to No. 5 terminal and the variable impedance 23. A negative feedback network 24 constructed of resistors $R_3$ and $R_4$ is connected between the output terminal and inverting input terminal (−) of the signal amplifier 13, whereby the voltage gain of this signal amplifier 13 is set. An output signal at the output terminal of the signal amplifier 13 is supplied to the overshoot suppressor 16. The overshoot suppressor 16 is constructed of a resistor $R_5$ and clamping diodes $D_1$ and $D_2$, and prevents the occurrence of an undesirable change due to a transient signal of high level. An output signal from the overshoot suppressor 16 is transmitted to the side path $l_s$ of the combining network 10 through a buffer 25 which is constructed in the form of an emitter follower.

On the other hand, the control amplifier 14 is also constructed in the form of a so-called operation amplifier and has a non-inverting input terminal (+), an inverting input terminal (−) and an output terminal. The non-inverting input terminal (+) is connected to No. 5 terminal and the variable impedance 23. The voltage gain of the control amplifier 14 is set by connecting a negative feedback network 26 which is constructed of resistors $R_6$, $R_7$ and $R_{103}$ and capacitors $C_6$ and $C_7$. No. 6 terminal is arranged for the connection of the resistor $R_{103}$ and the capacitors $C_6$ and $C_7$ of the negative feedback network 26 outside the semiconductor integrated circuit. An output signal of the control amplifier 14 is transmitted to the rectifier and integrator 15.

The rectifier and integrator 15 includes a rectifier 15a which is constructed of a diode $D_3$, and also includes an integrator 15b which is constructed of capacitors $C_8$ and $C_9$, resistors $R_{104}$ and $R_{105}$ and a diode $D_4$. The diode $D_4$ adjusts the so-called attack time and recovery time to appropriate values. No. 7 terminal and No. 8 terminal are arranged in order to connect the capacitors $C_8$ and $C_9$ and the resistors $R_{104}$ and $R_{105}$ of the integrator 15b outside the semiconductor integrated circuit. An output voltage of the integrator 15b is transmitted to a voltage-current converter 27.

This voltage-current converter 27 provides at its output a control signal current $S_c$ corresponding to the output voltage of the integrator 15b. The impedance value of the variable impedance 23 of the variable filter 12 is controlled in accordance with the magnitude of the control signal current $S_c$.

The variable filter 12, control amplifier 14, rectifier and integrator 15 and voltage-current converter 27 control the impedance value of the variable impedance 23 with the lowering of a signal level at a common terminal $T_5$ of the mode switch SW. Therefore, the level of a signal component at a frequency of about 200

Hz to be transmitted to the side path $l_s$ through the signal amplifier 13 and the overshoot suppressor 16 increases.

The combining network 10 is constructed of a resistor $R_8$ arranged on the main path $l_m$ and a resistor $R_9$ arranged on the side path $l_s$. A signal which is the added result between a signal component on the main path $l_m$ and a signal component on the side path $l_s$ is obtained at the common juncture between the resistors $R_8$ and $R_9$.

The inverter 11 is constructed in the form of a so-called operational amplifier, and has a non-inverting input terminal (+), an inverting input terminal (−) and an output terminal. The non-inverting input terminal (+) is connected to No. 4 terminal, the inverting input terminal (−) is connected to the common juncture of the resistors $R_8$ and $R_9$, and the output terminal is connected to No. 2 terminal. By properly setting the resistance value of a resistor $R_{10}$ connected between the output terminal and inverting input terminal (−) of the inverter 11 and the resistance values of the resistors $R_8$ and $R_9$, it is possible to set the level of an output signal of the switchable signal compressor/signal expander as is provided from No. 2 terminal.

In the case where the mode switch SW is connected to the terminal $T_3$, an output signal of the input amplifier 20 on the main path $l_m$ is transmitted to the common terminal $T_5$ of the switch. In this case, the signal component on the main path $l_m$ and the signal component on the side path $l_s$ are added, so that the circuit operates as an encoder.

On the other hand, in the case where the mode switch SW is connected to a terminal $T_4$, an output terminal of the inverter 11 is transmitted to the common terminal of the switch. In this case, the signal on the side path $l_s$ is subtracted from the signal on the main path $l_m$, so that the circuit operates as a decoder.

No. 9 terminal is connected to a controller 28. When the terminal No. 9 is connected to ground potential by a switch, the controller 28 stops the operation of the voltage-current converter 27. Further, No. 10 terminal is a supply voltage-feeding terminal, and No. 11 terminal is a grounding terminal.

It is worthy of special mention that, according to the fundamental technical idea of the present invention, the non-inverting input terminal (+) of the control amplifier 14 on the side path $l_s$ is not D.C. coupled to the output terminal of the signal amplifier 13, but is connected to the variable impedance 23 within the variable filter 12. This variable impedance 23 is supplied with the reference voltage $V_{REF}$ from the reference voltage generator 22 through the resistors $R_{101}$ and $R_{102}$ of the variable filter 12. An input impedance at the non-inverting input terminal (+) and an input impedance at the inverting input terminal (−) of the control amplifier 14 are very great and the D.C. negative feedback is performed 100% from the output terminal to the inverting input terminal thereof through the negative feedback network 26, so that the respective D.C. potentials of the non-inverting input terminal (+), inverting input terminal (−) and output terminal of the control amplifier 14 are set at levels approximate to the reference voltage $V_{REF}$. Accordingly, the operating point of the rectifier 15a is set at a potential of a level approximate to the reference voltage $V_{REF}$.

If the non-inverting input terminal (+) of the control amplifier 14 is D.C. coupled to the output terminal of the signal amplifier 13 in accordance with the prior art, the operating point of the rectifier 15a has a great deviation, with the result that the transfer characteristic of the side path $l_s$ has a great deviation. More specifically, even when the input impedances at the non-inverting input terminal (+) and inverting input terminal (−) of the signal amplifier 13 are very great, actually D.C. input currents $i_{(+)IN}$ and $i_{(-)IN}$ which are not negligible flow into the non-inverting input terminal (+) and the inverting input terminal, respectively. In such case, accordingly, a D.C. voltage $V_o$ at the output terminal of the signal amplifier 13 departs from the reference voltage $V_{REF}$ as indicated by the following equation granted that the D.C. offset current $i_{(-)IN}$ flowing into the inverting input terminal (−) is sufficiently smaller than a D.C. current $i_f$ flowing through the resistors $R_3$ and $R_4$.

$$V_o = V_{REF} - \frac{(R_3 + R_4)}{R_4} \cdot (R_{101} + R_{102}) \cdot i_{(+)IN} \quad (1)$$

$$= V_{REF} - V_{off}$$

Accordingly, the D.C. offset voltage $V_{off}$ of the output voltage $V_o$ of the signal amplifier 13 has a great deviation dependent upon the resistors $R_3$, $R_4$, $R_{101}$ and $R_{102}$ and the D.C. input current $i_{(+)IN}$. Further, this D.C. offset voltage $V_{off}$ has also a deviation dependent upon the voltage-current characteristics of the clamping diodes $D_1$ and $D_2$ of the overshoot suppressor 16.

In contrast, according to this invention, the non-inverting input terminal (+) of the control amplifier 14 is not affected by the output voltage of the signal amplifier 13 having the D.C. offset voltage $V_{off}$ of such great deviation.

To be further noted is the fact that, since the D.C. blocking capacitor $C_6$ is disposed in the negative feedback network 26 of the control amplifier 14, no D.C. current flows through the resistor $R_7$ of the negative feedback network 26.

Consequently, D.C. input currents $i'_{(+)IN}$ and $i'_{(-)IN}$ which flow into the non-inverting input terminal (+) and inverting input terminal (−) of the control amplifier 14 respectively and the voltage $V_o'$ at the output terminal thereof are given by the following equation, and the output voltage $V_o'$ of the control amplifier 14 has only a very small D.C. offset voltage $V'_{off}$.

$$V'_o = V_{REF} - (R_{101} + R_{102}) \cdot i'_{(+)IN} + R_6 \cdot i'_{(-)IN} \quad (2)$$

$$= V_{REF} - V'_{off}$$

In this manner, the D.C. offset voltage $V'_{off}$ developed at the output of the control amplifier 14 can be maintained within permissible limits for the rectifier 15a by means of this invention.

In the prior art, the signal on the side path $l_s$ is amplified by the signal amplifier 13 and the control amplifier 14 and then transmitted to the rectifier 15a, whereas in accordance with this invention, the signal on the side path $l_s$ is amplified only by the control amplifier 14 and then transmitted to the rectifier 15a. Accordingly, the ratio between the resistances $R_6$ and $R_7$ of the negative feedback network of the control amplifier 14 must be set at a value greater than in the prior art.

In accordance with the embodiment disclosed in FIG. 3, the D.C. reference voltage $V_{REF}$ to be generated by the reference voltage generator 22 is set at a level equal to about one-half of the supply voltage $V_{CC}$, whereby the respective output D.C. levels of the signal amplifier 13, control amplifier 14, input amplifier 20 and inverter 11 can be maintained at levels equal to about one-half of the supply voltage $V_{CC}$, and hence, the dynamic ranges of the respective outputs can be made greater.

This invention is not restricted to the foregoing embodiment, but it can adopt various modified aspects of performance in accordance with its fundamental technical idea. By way of example, in order to set the Dolby level at a predetermined value, a method can also be resorted to in which, in setting each of the resistance values of the resistors $R_1 - R_{10}$ within the monolithic semiconductor integrated circuit, a resistor of the most appropriate resistance value is selectively connected from among a plurality of resistors by the use of the master slice of an aluminum interconnection.

Figure 4:
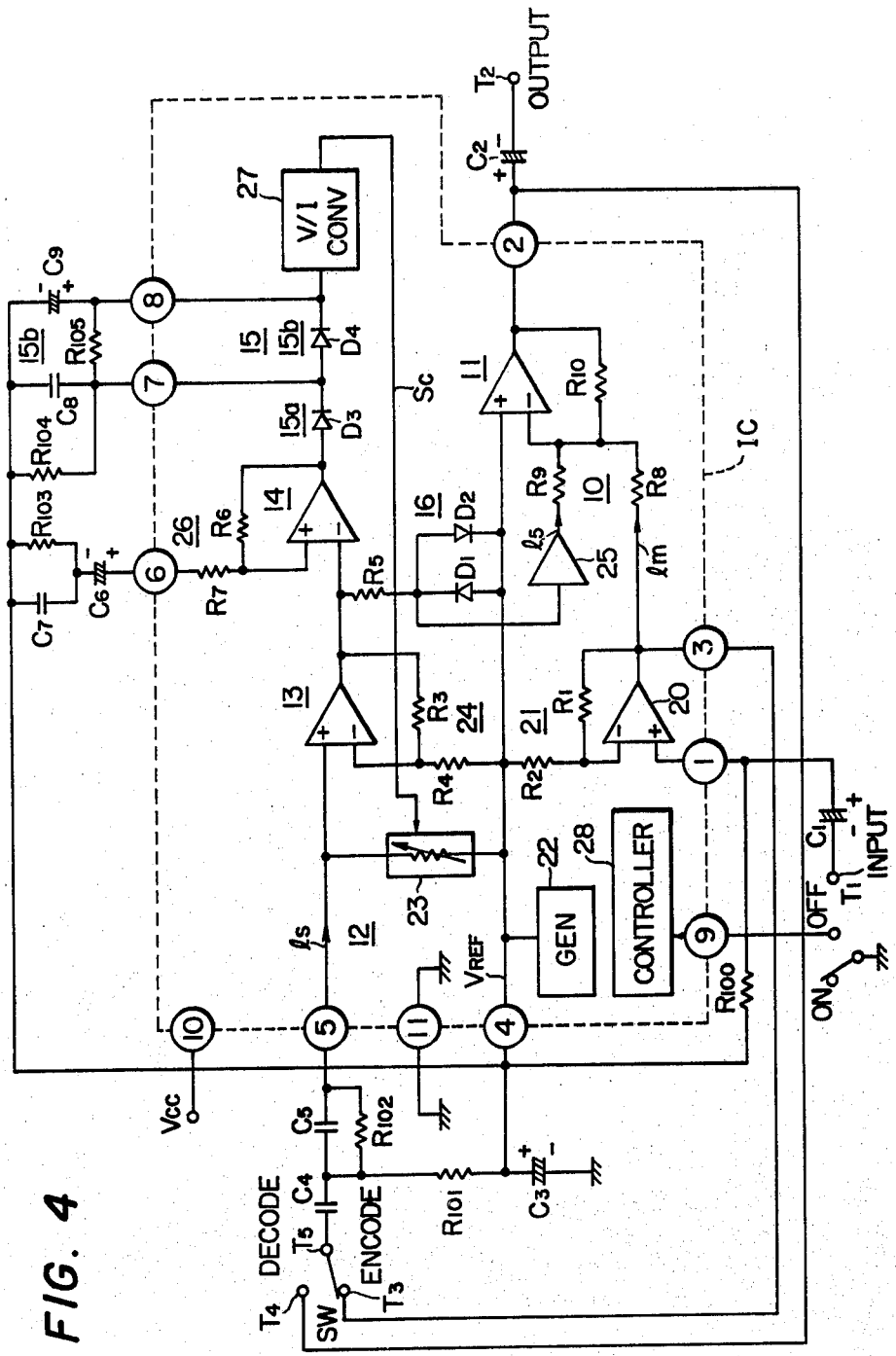
FIG. 4 is a schematic block diagram of a switchable signal compressor/signal expander according to another embodiment of this invention.

FIG. 4 shows a switchable signal compressor/signal expander according to another embodiment of this invention. Components within the broken lines IC are constructed as a monolithic semiconductor integrated circuit. Numerals enclosed with circles indicate terminal Nos. of the integrated circuit.

A combining network 10 and an inverter 11 are arranged on a main path $l_m$ which extends between an input terminal $T_1$ and an output terminal $T_2$. The input terminal $T_1$ is connected to the No. 1 terminal of the integrated circuit through an input coupling capacitor $C_1$. An input amplifier 20 is constructed in the form of an operational amplifier, and has a non-inverting input terminal (+), an inverting input terminal (−) and an output terminal. The non-inverting input terminal (+) is connected to the terminal No. 1. The output terminal of this amplifier is connected to a terminal $T_3$ of a mode switch SW outside the integrated circuit as the No. 3 terminal of the integrated circuit, and is also connected to the main path $l_m$. A negative feedback network 21 constructed of resistors $R_1$ and $R_2$ is connected between the output terminal and the inverting input terminal (−) of the input amplifier 20, whereby the voltage gain of this input amplifier 20 is set.

One end of the resistor $R_2$ of the negative feedback network 21 is grounded A.C.-wise by a capacitor $C_3$ which is connected to the No. 4 terminal. A reference voltage generator 22 feeds the terminal No. 4 with a D.C. reference voltage $V_{REF}$. A resistor $R_{100}$ is connected between the terminals No. 1 and No. 4, whereby the D.C. reference voltage $V_{REF}$ is fed to the terminal No. 1 Accordingly, also the D.C. potential of the output terminal of the input amplifier 20 is set to a level approximate to the D.C. reference voltage $V_{REF}$.

On a side path $l_s$ extending between the mode switch SW and the output terminal $T_2$, there are arranged a variable filter 12, a rectifier and integrator 15 and an overshoot suppressor 16. The variable filter 12 is constructed of capacitors $C_4$ and $C_5$, resistors $R_{101}$ and $R_{102}$ and a variable impedance 23.

The mode switch SW is connected to No. 5 terminal of the integrated circuit through the capacitors $C_4$ and $C_5$. The variable impedance 23 is connected to this terminal No. 5.

The signal amplifier 13 is constructed in the form of an operational amplifier, and has a non-inverting input terminal (+), an inverting input terminal (−) and an output terminal. The non-inverting input terminal (+) is connected to the No. 5 terminal and the variable impedance 23. A negative feedback network 24 constructed of resistors $R_3$ and $R_4$ is connected between the output terminal and the inverting input terminal (−) of the signal amplifier 13, whereby the voltage gain of this signal amplifier 13 is set. An output signal at the output terminal of the signal amplifier 13 is supplied to the overshoot suppressor 16. The overshoot suppressor 16 is constructed of a resistor $R_5$ and clamping diodes $D_1$ and $D_2$, and prevents the occurrence of an undesirable change due to a transient signal of high level.

An output signal from the overshoot suppressor 16 is transmitted to the side path $l_s$ of the combining network 10 through a buffer 25 which is constructed in the form of an emitter follower.

On the other hand, the control amplifier 14 is constructed in the form of an operational amplifier and has a non-inverting input terminal (+), an inverting input terminal (−) and an output terminal. The inverting input terminal (−) of this amplifier 14 is connected to the output terminal of the signal amplifier 13. The voltage gain of the control amplifier 14 is set by connecting a negative feedback network 26 which is constructed of resistors $R_6$, $R_7$ and $R_{103}$ and capacitors $C_6$ and $C_7$. The No. 6 terminal is arranged for the connection of the resistor $R_{103}$ and the capacitors $C_6$ and $C_7$ of the negative feedback network 26 outside the semiconductor integrated circuit. An output signal of the control amplifier 14 is transmitted to the rectifier and integrator 15.

The rectifier and integrator 15 includes a rectifier 15a which is constructed of a diode $D_3$, and also includes an integrator 15b which is constructed of capacitors $C_8$ and $C_9$, resistors $R_{104}$ and $R_{105}$ and a diode $D_4$. The diode $D_4$ adjusts the so-called attack time and recovery time to appropriate values. No. 7 terminal and No. 8 terminal are arranged in order to connect the capacitors $C_8$ and $C_9$ and the resistors $R_{104}$ and $R_{105}$ of the integrator 15b outside the semiconductor integrated circuit. An output voltage of the integrator 15b is transmitted to a voltage-current converter 27.

This voltage-current converter 27 provides at its output a control signal current $S_c$ corresponding to the output voltage of the integrator 15b. The impedance value of the variable impedance 23 of the variable filter 12 is controlled in accordance with the magnitude of the control signal current $S_c$.

The variable filter 12, control amplifier 14, rectifier and integrator 15 and voltage-current converter 27 control the impedance value of the variable impedance 23 with the lowering of a signal level at a common terminal $T_5$ of the mode switch SW. Therefore, the level of a signal component at a frequency above 200 Hz to be transmitted to the side path $l_s$ through the signal amplifier 13 and the overshoot suppressor 16 increases.

The combining network 10 is constructed of a resistor $R_8$ arranged on the main path $l_m$ and a resistor $R_9$ arranged on the side path $l_s$. A signal which is the added result between a signal component on the main path $l_m$ and a signal component on the side path $l_s$ is obtained at the common juncture between the resistors $R_8$ and $R_9$.

The inverter 11 is constructed in the form of an operational amplifier, and has a non-inverting input terminal (+), an inverting input terminal (−) and an output terminal. The non-inverting input terminal (+) is connected to the No. 4 terminal, the inverting input terminal (−) is connected to the common junction of the resistors $R_8$ and $R_9$, and the output terminal is connected to the No. 2 terminal. By properly setting the resistance value of a resistor $R_{10}$ connected between the output terminal and inverting input terminal (−) of the inverter 11 and the resistance values of the resistors $R_8$ and $R_9$, it is possible to set the level of an output signal of the switchable signal compressor/signal expander as is provided from the No. 2 terminal.

In the case where the mode switch SW is connected to the terminal T3, an output signal of the input amplifier 20 on the main path $l_m$ is transmitted to the common terminal T5 of the switch. In this case, the signal component on the main path $l_m$ and the signal component on the side path $l_s$ are added, so that the circuit blocks operate as an encoder.

On the other hand, in the case where the mode switch SW is connected to a terminal T4, an output terminal of the inverter 11 is transmitted to the common terminal of the switch. In this case, the signal on the side path $l_s$ is subtracted from the signal on the main path $l_m$, so that the circuit blocks operate as a decoder.

The No. 9 terminal is connected to a controller 28. When the terminal No. 9 is connected to ground potential by a switch, the controller 28 stops the operation of the voltage-current converter 27. Further, the No. 10 terminal is a supply voltage-feeding terminal, and the No. 11 terminal is a grounding terminal.

The reference voltage generator 22 supplies the D.C. reference voltage $V_{REF}$ to the respective non-inverting input terminals (+) of the input amplifier 20, inverter 11 and signal amplifier 13, thereby to maintain D.C. voltages at the output terminals of the respective amplifiers at levels approximate to this D.C. reference voltage. Since the output voltage of the signal amplifier 13 is supplied to the inverting input terminal (−) of the control amplifier 14, the output D.C. level of the control amplifier 14 is also maintained at a level approximate to the D.C. reference voltage.

In order to set the dynamic ranges of the output voltages of the respective amplifiers 20, 11, 13 and 14 to be great, the D.C. reference voltage $V_{REF}$ is set at the level equal to about one-half of the supply voltage $V_{CC}$ fed to the No. 10 terminal. Accordingly, even when the voltage value of the supply voltage $V_{CC}$ fed to the terminal No. 10 has fluctuated, the reference voltage generator 22 generates the D.C. reference voltage $V_{REF}$ of the level of about one-half of the supply voltage $V_{CC}$ against the fluctuation.

In this manner, the D.C. reference voltage $V_{REF}$ to be produced from the reference voltage generator 22 fluctuates in correspondence with the fluctuation of the supply voltage $V_{CC}$. Heretofore, there has been the disadvantage that, on account of such fluctuation of the D.C. reference voltage $V_{REF}$, a charging current or discharging current flows through the rectifier and integrator to make the detection characteristic fluctuate undesirably.

According to this embodiment, to the end of eliminating the aforecited disadvantage, the other ends of the capacitors C8 and C9 of the integrator 15b are not D.C. grounded, but they are connected to the No. 4 terminal thereby to be supplied with the D.C. reference voltage $V_{REF}$ produced from the reference voltage generator 22.

On the other hand, more preferably, the other ends of the capacitor C7 and resistor R103 of the negative feedback network 26 of the control amplifier 14 are not D.C. grounded, but they are similarly connected to the terminal No. 4 thereby to be supplied with the D.C. reference voltage $V_{REF}$ produced from the reference voltage generator 22 as illustrated in FIG. 4.

Thus, according to such preferred embodiment, even when the D.C. reference voltage $V_{REF}$ produced from the reference voltage generator 22 has fluctuated, no charging current or discharging current flows through the capacitors C6 and C7 of the negative feedback network 26 of the control amplifier 14 or the capacitors C8 and C9 of the integrator 15b, and the undesirable fluctuation of the detection characteristic can be prevented.

Figure 5:
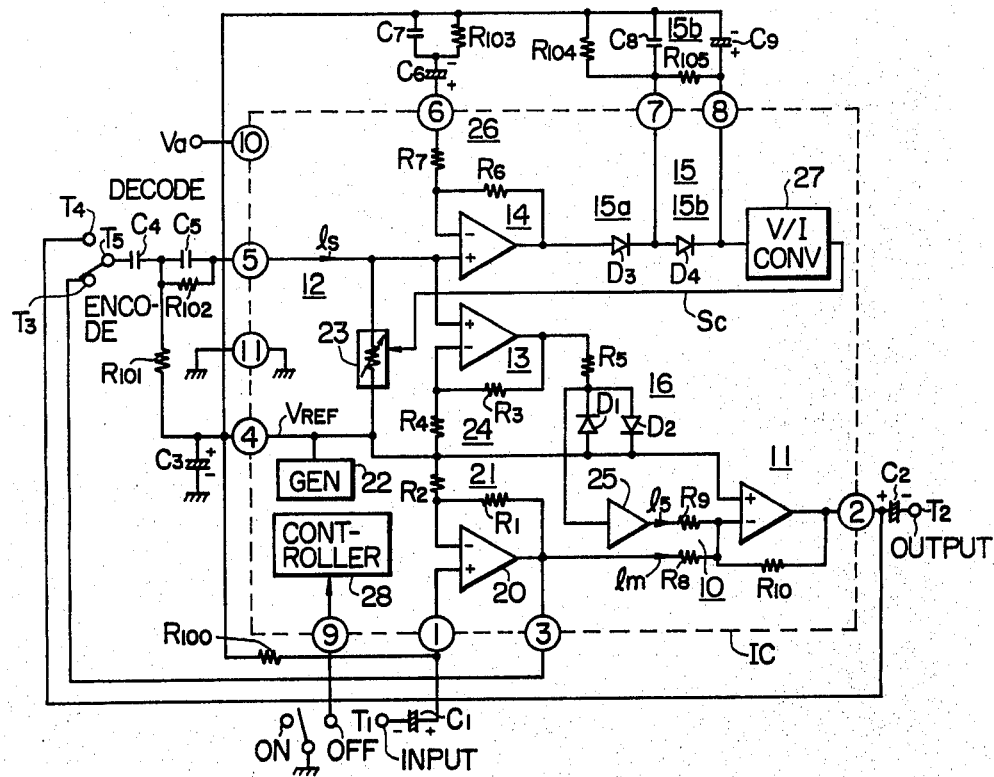
FIG. 5 is a schematic block diagram of a switchable signal compressor/signal expander according to a modified embodiment of this invention.

FIG. 5 shows a preferred embodiment according to another modification of this invention. As in the case of the embodiment of FIG. 3, the non-inverting input terminal (+) of the control amplifier 14 on the side path $l_s$ is not D.C. coupled to the output terminal of the signal amplifier 13, but is connected to the variable impedance 23 within the variable filter 12. Also, as in the embodiment of FIG. 4, the other ends of the capacitor C7 and resistor R103 of the negative feedback network 26 of the control amplifier 14 are not D.C. grounded, but are connected to the terminal No. 4 so as to be supplied with the D.C. reference voltage $V_{REF}$ produced by the reference voltage generator 22.

While we have shown and described several embodiments in accordance with the present invention, it is to be understood that the invention is not limited to the details shown and described herein but is susceptible of numerous changes and modifications as known to a person skilled in the art, and we therefore do not wish to be limited to the details shown and described herein but intend to cover all such changes and modifications as are obvious to one of ordinary skill in the art.

What is claimed is:

1. A switchable signal compressor/signal expander comprising a combining network and an inverter which are connected in series to form a main path extending between an input terminal and an output terminal; a variable filter and a signal amplifier which are connected in series to form a side path coupled to said combining network; a control amplifier and a rectifier and integrator circuit which are connected in series to control the transfer of said variable filter, an input terminal of said control amplifier being connected to receive the output of said variable filter without passing through said signal amplifier; and a mode switch connected to apply to said side path either the input signal of said combining network or the output signal of said inverter.

2. A switchable signal compressor/signal expander as defined in claim 1, wherein said signal amplifier and said control amplifier are each constructed in the form of an operational amplifier having their non-inverting input terminal connected to the output of said variable filter.

3. A switchable signal compressor/signal expander as defined in claim 2, wherein said variable filter includes a variable impedance, and wherein at least said variable impedance, said signal amplifier, and said control amplifier are constructed within a monolithic semiconductor integrated circuit.

4. A switchable signal compressor/signal expander as defined in claim 2, wherein a first negative feedback network is connected between the output terminal and the inverting input terminal of said signal amplifier, and a second negative feedback network is connected between the output terminal and the inverting input terminal of said control amplifier.

5. A switchable signal compressor/signal expander as defined in claim 4, wherein said first negative feedback network includes a first resistor which is connected between said output terminal and said inverting input terminal of said signal amplifier, and a second resistor one end of which is connected to said inverting input terminal of said signal amplifier and the other end of which is connected to a predetermined operating potential, and wherein said second negative feedback network includes a third resistor which is connected between said output terminal and said inverting input terminal of said control amplifier, and a fourth resistor one end of which is connected to said inverting input terminal of said control amplifier and the other end of which is connected to a predetermined operating potential through a D.C. blocking capacitor.

6. A switchable signal compressor/signal expander as defined in claim 5, further including a reference voltage generator for producing a D.C. reference voltage constructed within a monolithic semiconductor integrated circuit (IC), and means for feeding said D.C. reference voltage to said non-inverting input terminal of said signal amplifier and to said non-inverting input terminal of said control amplifier and also to the other end of said second resistor of said first negative feedback network.

7. A switchable signal compressor/signal expander as defined in claim 6, wherein the output signal of said signal amplifier is applied from said side path to said combining network through an overshoot suppressor.

8. A switchable signal compressor/signal expander as defined in claim 6, wherein said variable filter includes a variable impedance, and wherein at least said variable impedance, said signal amplifier, and said control amplifier are constructed within said monolithic semiconductor integrated circuit.

9. A switchable signal compressor/signal expander comprising a combining network and an inverter connected in series on a main path extending between an input terminal and an output terminal; a variable filter and a signal amplifier connected in series on a side path coupled to said combining network; a control amplifier; rectifier and integrator means connected to said control amplifier for controlling the transfer function of said variable filter; a mode switch connected to apply to said side path either the input signal of said combining network or the output signal of said inverter; a reference voltage generator which produces a D.C. reference voltage; means for maintaining an output D.C. level of said control amplifier at a level approximate to said D.C. reference voltage; said rectifier and integrator means including a rectifier element, a first resistor, a second resistor, a first capacitor and a second capacitor, one end of said rectifier element being connected to the output terminal of said control amplifier, one end of each of said first resistor, said first capacitor and said second resistor being connected to the other end of said rectifier element, the other end of said second resistor and one end of said second capacitor being connected in common as an output terminal of said rectifier and integrator means, the other end of each of said first resistor, said first capacitor and said second capacitor being supplied with said D.C. reference voltage produced from said reference voltage generator.

10. A switchable signal compressor/signal expander as defined in claim 9, wherein said variable filter includes a variable impedance, and wherein at least said variable impedance, said signal amplifier, said control amplifier and said reference voltage generator are constructed within a monolithic semiconductor integrated circuit.

11. A switchable signal compressor/signal expander as defined in claim 9, wherein each of said signal amplifier and said control amplifier is constructed in the form of an operation amplifier, a first negative feedback network is connected between an output terminal and an inverting input terminal of said signal amplifier, a second negative feedback network is connected between said output terminal and an inverting input terminal of said control amplifier, and means for supplying said D.C. reference voltage produced from said reference voltage generator to a non-inverting input terminal of said control amplifier.

12. A switchable signal compressor/signal expander as defined in claim 11, wherein said first negative feedback network includes a third resistor which is connected between said output terminal and said inverting input terminal of said signal amplifier, and a fourth resistor one end of which is connected to said inverting input terminal of said signal amplifier and the other end of which is supplied with said D.C. reference voltage, and said second negative feedback network includes a fifth resistor which is connected between said output terminal and said inverting input terminal of said control amplifier, and a sixth resistor one end of which is connected to said inverting input terminal of said control amplifier and the other end of which is connected to said D.C. reference voltage through a D.C. blocking capacitor.

13. A switchable signal compressor/signal expander as defined in claim 12, wherein an output signal of said signal amplifier is transmitted from said side path to said combining network through an overshoot suppressor.

* * * * *